(12) United States Patent
Burrows et al.

(10) Patent No.: US 8,657,994 B2
(45) Date of Patent: Feb. 25, 2014

(54) SYSTEM AND METHOD FOR IMPROVED EPITAXIAL LIFT OFF

(75) Inventors: Brian Burrows, San Jose, CA (US);
Brian Brown, Palo Alto, CA (US);
Thomas Gmitter, Sunnyvale, CA (US);
Gang He, Cupertino, CA (US)

(73) Assignee: Alta Devices, Inc., Palo Alto, CA (US)

( * ) Notice: Subject to any disclaimer, the term of this patent is extended or adjusted under 35 U.S.C. 154(b) by 263 days.

(21) Appl. No.: 13/078,722

(22) Filed: Apr. 1, 2011

(65) Prior Publication Data
US 2012/0247685 A1 Oct. 4, 2012

(51) Int. Cl.
*B32B 38/10* (2006.01)
(52) U.S. Cl.
USPC .......... 156/703; 156/714; 156/764; 156/930; 156/931; 29/426.6
(58) Field of Classification Search
USPC .......... 156/703, 714, 764, 930, 941; 29/426.6
See application file for complete search history.

(56) References Cited

U.S. PATENT DOCUMENTS

| | | | | |
|---|---|---|---|---|
| 4,846,931 | A * | 7/1989 | Gmitter et al. | 438/26 |
| 6,821,376 | B1 * | 11/2004 | Rayssac et al. | 156/701 |
| 8,029,643 | B2 * | 10/2011 | Sanocki et al. | 156/716 |
| 8,245,754 | B2 * | 8/2012 | Fujita et al. | 156/764 |
| 8,367,518 | B2 * | 2/2013 | Gmitter et al. | 438/458 |
| 2002/0139474 | A1 * | 10/2002 | Nomura et al. | 156/344 |
| 2009/0314430 | A1 * | 12/2009 | Nakamura | 156/344 |
| 2011/0214805 | A1 * | 9/2011 | Brown et al. | 156/247 |
| 2012/0000613 | A1 * | 1/2012 | Thallner | 156/703 |

* cited by examiner

*Primary Examiner* — Mark A Osele

(57) ABSTRACT

An apparatus, system and method for performing ELO are disclosed. Device assemblies are contemporaneously etched in a stacked arrangement. Each device assembly may be placed in a respective tray, where the trays are overlapped and spaced apart from one another. In this manner, more device assemblies can be etched per unit area compared to conventional systems. Further, by stacking device assemblies during etching, the yield can be improved and/or the cost of the etch tank and associated hardware can be reduced.

9 Claims, 13 Drawing Sheets

SYSTEM AND METHOD FOR IMPROVED EPITAXIAL LIFT OFF

BACKGROUND OF THE INVENTION

Epitaxial lift off (ELO) is typically performed on device assemblies to separate a substrate from a device by etching a release layer disposed between the substrate and the device. Conventional systems perform ELO by supplying an array of substrates and devices attached to a carrier film into an etch tank. Hydrofluoric acid (HF) is used to etch the release layer to separate the substrates from the devices. After the etching is complete, the devices attached to the carrier film are removed from the etch tank for further processing and to enable etching of the next batch of devices and substrates.

Although conventional systems can be used to perform ELO, the number of device assemblies that can be etched simultaneously using conventional systems is limited by the footprint or size of the etch tank. Thus, the yield of etched device assemblies using conventional systems is relatively low.

Additionally, the cost of the etch tanks and associated hardware is proportional to the size of the etch tanks. Therefore, even if a conventional system were sized to supply an acceptable yield, the size and cost of that system would be prohibitively high.

SUMMARY OF THE INVENTION

Accordingly, a need exists to perform epitaxial lift off (ELO) with improved yield. Additionally, a need exists to perform ELO with reduced cost. Embodiments of the present invention provide novel solutions to these needs and others as described below.

Embodiments of the present invention are directed to an apparatus, system and method for performing ELO. More specifically, device assemblies are contemporaneously etched in a stacked arrangement. Each device assembly may be placed in a respective tray, where the trays are overlapped and spaced apart from one another. In this manner, more device assemblies can be etched per unit area compared to conventional systems. Further, by stacking device assemblies during etching, the yield can be improved and/or the cost of the etch tank and associated hardware can be reduced.

In one embodiment, each device assembly may be clamped to a respective tray using a respective first member. A respective second member corresponding to each tray may be used to apply a bending load to the device assemblies during etching to separate the substrates from the device assemblies. Hydrofluoric acid (HF) may be applied to each device assembly (e.g., by submerging the device assembly in HF, by pooling the HF in each tray around a respective device assembly, by spraying or otherwise directing the HF toward a respective release layer of each device assembly, etc.) to perform the etching, where the HF may be applied to each device assembly and/or allowed to flow away from each device assembly using a respective third member corresponding to each tray. In one embodiment, components corresponding to each tray (e.g., first members used to clamp the device assemblies to the racks, second members used to apply a bending load to the device assemblies, third members used to apply HF to and/or allow the HF to flow away from the device assemblies during etching, etc.) may be moved contemporaneously using a common component (e.g., a first component coupled with the first members, a second component coupled with the second members, a third component coupled with the third members, etc.), thereby reducing the number of components in the system, the failure rate of the system, the cost of the system, some combination thereof, etc.

In one embodiment, an apparatus includes a plurality of trays operable to accept a plurality of device assemblies, wherein each device assembly of the plurality of device assemblies includes a respective device and a respective substrate, wherein the plurality of trays are physically spaced apart from one another in a stacked arrangement. A first plurality of members is operable to clamp the plurality of device assemblies to the plurality of trays, and wherein the first plurality of members is coupled with a first component operable to contemporaneously move the first plurality of members. A second plurality of members is operable to apply a bending load to the plurality of device assemblies, wherein the second plurality of members is further operable to enable separation of the respective device and the respective substrate responsive to an etching of a respective release layer disposed between the respective device and the respective substrate, and wherein the second plurality of members is coupled with a second component operable to contemporaneously move the second plurality of members.

In another embodiment, a system includes a tank and an apparatus disposed at least partially within the tank, wherein the apparatus includes a plurality of trays operable to accept a plurality of device assemblies, wherein each device assembly of the plurality of device assemblies includes a respective device and a respective substrate, wherein the plurality of trays are physically spaced apart from one another in a stacked arrangement. A first plurality of members of the apparatus is operable to clamp the plurality of device assemblies to the plurality of trays, and wherein the first plurality of members is coupled with a first component. A second plurality of members of the apparatus is operable to apply a bending load to the plurality of device assemblies, wherein the second plurality of members is further operable to enable separation of the respective device and the respective substrate responsive to an etching of a respective release layer disposed between the respective device and the respective substrate, and wherein the second plurality of members is coupled with a second component. The system further includes a first actuator operable to interface with the first component and contemporaneously move the first plurality of members. A second actuator is operable to interface with the second component and contemporaneously move the second plurality of members.

In yet another embodiment, a method of performing epitaxial lift off includes clamping, using a first plurality of members of an apparatus, a plurality of device assemblies to a plurality of trays of the apparatus, wherein each device assembly of the plurality of device assemblies includes a respective device and a respective substrate, wherein the plurality of trays are physically spaced apart from one another in a stacked arrangement, and wherein the first plurality of members is coupled with a first component operable to contemporaneously move the first plurality of members. A bending load is applied, using a second plurality of members of the apparatus, to the plurality of device assemblies, and wherein the second plurality of members is coupled with a second component operable to contemporaneously move the second plurality of members. The method further includes etching a respective release layer disposed between the respective device and the respective substrate to separate the respective device and the respective substrate.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION OF THE INVENTION

Reference will now be made in detail to embodiments of the present invention, examples of which are illustrated in the accompanying drawings. While the present invention will be discussed in conjunction with the following embodiments, it will be understood that they are not intended to limit the present invention to these embodiments alone. On the contrary, the present invention is intended to cover alternatives, modifications, and equivalents which may be included with the spirit and scope of the present invention as defined by the appended claims. Furthermore, in the following detailed description of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

EMBODIMENTS OF THE INVENTION

Figure 1:
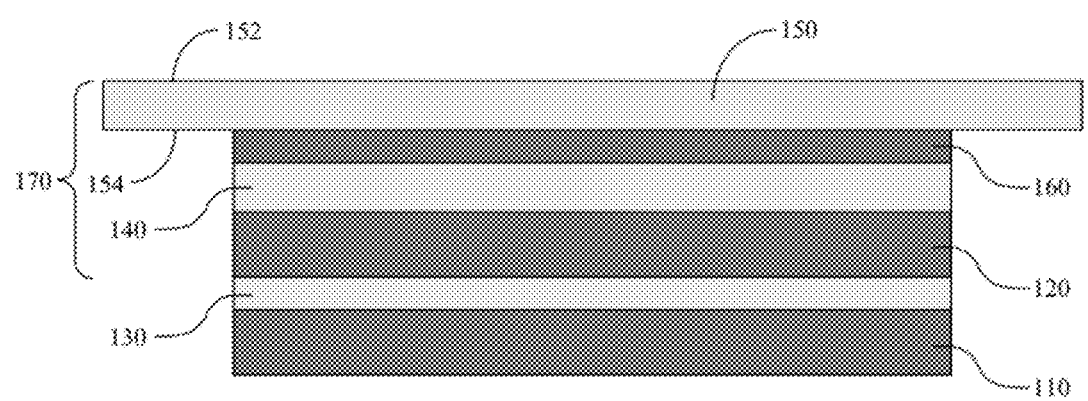
FIG. 1 shows a side view of an exemplary device assembly in accordance with one embodiment of the present invention.
Figure 2:
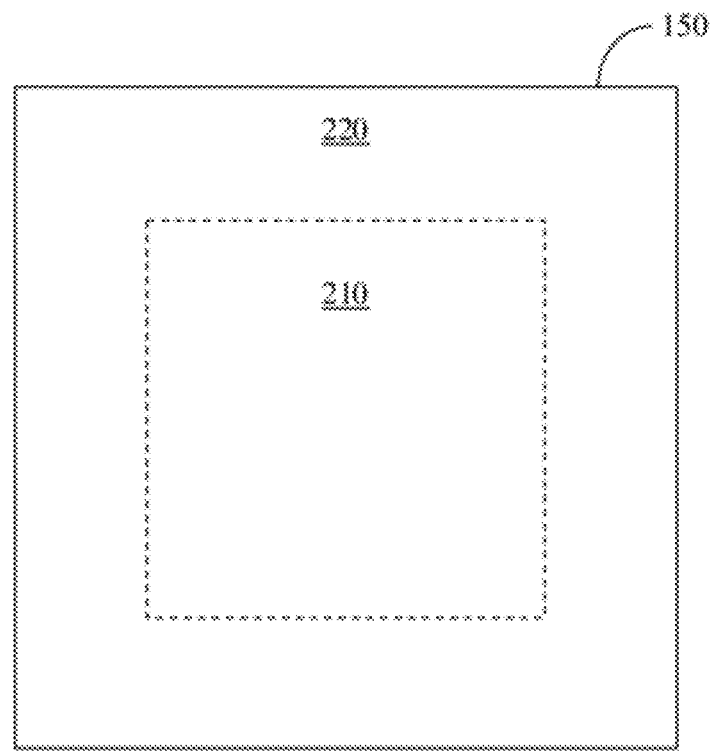
FIG. 2 shows a diagram of a bottom surface of a film in accordance with one embodiment of the present invention.

Embodiments of the present invention can improve epitaxial lift off (ELO) by contemporaneously etching device assemblies in a stacked arrangement. For example, each device assembly (e.g., as shown in FIGS. 1 and 2) may be placed in a respective tray of an apparatus, where the trays are overlapped and spaced apart from one another (e.g., as shown in FIGS. 5-13). In this manner, more device assemblies can be etched per unit area compared to conventional systems. Further, by stacking device assemblies during etching, the yield can be improved and/or the cost of the etch tank and associated hardware can be reduced.

FIG. 1 shows a side view of exemplary device assembly 100 in accordance with one embodiment of the present invention. As shown in FIG. 1, release layer 130 is disposed between substrate 110 and device 120. At least one layer 140 is disposed on device 120, and film 150 is coupled with at least one metal layer 140 via adhesive layer 160. In this manner, embodiments of the present invention may be used to perform epitaxial lift off (ELO) on device assembly 100 to remove substrate 110 from device sub-assembly 170 (e.g., by etching release layer 130 to separate substrate 110 from device 120).

Device 120 may be any semiconductor device such as a solar cell, light emitting diode (LED), etc. Device 120 may include a plurality of layers. As such, embodiments of the present invention may be used to perform ELO for one or more types of devices.

As shown in FIG. 1, release layer 130 may be any material capable of being etched (e.g., aluminum arsenide, etc.). In one embodiment, substrate 110 may be any material capable of adhering to release layer 130 and/or capable of growing one or more layers (e.g., release layer 130, device 120, etc.) epitaxially. For example, substrate 110 may include gallium arsenide, germanium, etc.

As shown in FIG. 1, at least one layer 140 may perform one or more functions. For example, at least one layer 140 may provide mechanical support for device 120, provide at least one electrical contact for device 120, provide optical reflection for device 120, etc. Accordingly, at least one layer 140 may be made from a metal in one embodiment.

In one embodiment, one or more layers of device assembly 100 may be grown on top of one another. For example, release layer 130 may be grown on substrate 110. As another example, one or more layers of device 120 may be grown on release layer 130. And as yet another example, one or more layers of at least one layer 140 may be grown on device 120.

As shown in FIG. 1, film 150 may be any material which is flexible or capable of being bent (e.g., responsive to a bending load applied thereto). For example, film 150 may be made of Polyethylene terephthalate (PET), another type of plastic, a material other than a polymer, etc.

Film 150 may have top surface 152 and bottom surface 154, where bottom surface 154 may be disposed on adhesive layer 160. In one embodiment, film 150 may overhang or be larger than (e.g., in one or more dimensions) at least one other layer of device assembly 100 (e.g., as shown in FIG. 2). And in one embodiment, adhesive layer 130 may overhang or be larger than (e.g., in one or more dimensions) at least one other layer of device assembly 100.

FIG. 2 shows a diagram of bottom surface 154 of film 150 in accordance with one embodiment of the present invention. As shown in FIG. 2, bottom surface 154 may be divided into regions 210 and 220. At least one other layer of device assembly 100 (e.g., substrate 110, release layer 130, device 120, at least one layer 140, adhesive layer 160, etc.) may attach to or be coupled with region 210. Region 220 of film 150 may extend beyond the at least one other layer of device assembly 100. In this manner, film 150 may be larger than at least one other layer of device assembly 100 in at least one dimension.

Although FIG. 1 depicts device assembly 100 with a particular number, size, and shape of layers, it should be appreciated that device assembly 100 may include a different number, size and/or shape of layers in other embodiments. Additionally, although FIG. 1 depicts device assembly 100 with a particular arrangement or ordering of layers, it should be appreciated that device assembly 100 may include a different arrangement or ordering of layers in other embodiments. Further, although FIG. 2 depicts bottom surface 154 with a particular size and shape of regions, it should be appreciated that bottom surface 154 may include a different size and/or shape of regions in other embodiments.

Figure 3:
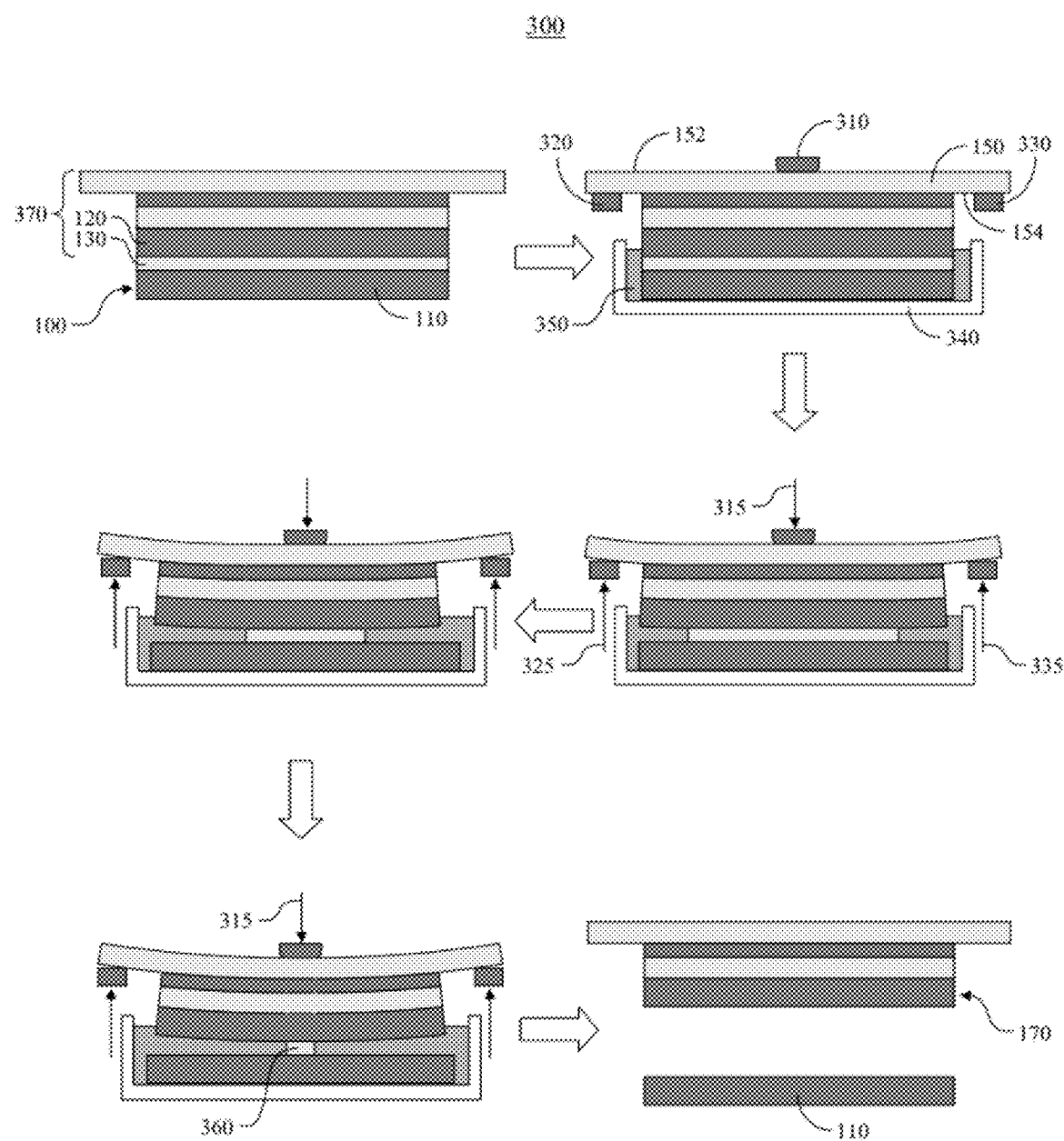
FIG. 3 shows an exemplary epitaxial lift off performed in accordance with one embodiment of the present invention.

FIG. 3 shows an exemplary ELO performed in accordance with one embodiment of the present invention. As shown in FIG. 3, device assembly 100 may be loaded into tray 340. Member 310 may be brought into contact with top surface 152 to clamp device assembly 100 in tray 340. Member 320 and/or member 330 may be brought into contact with bottom surface 154 of film 150 (e.g., within region 220), where a relative movement between member 310 and members 320 and 330 (e.g., as depicted by arrows 315, 325 and 335) may apply a bending load to device assembly 100. Release layer 130 may be etched by fluid 350 until substrate 110 is separated from device sub-assembly 170.

In one embodiment, the bending load imparted on device assembly 100 (e.g., using members 310, 320 and 330) may accelerate or otherwise assist in removing release layer 130 from device assembly 100 during etching. For example, the gap between substrate 110 and device 120 may be widened as a result of the bending load, thereby allowing fluid 350 to more easily reach the remaining portion of release layer 130 and continue the etching thereof.

Additionally, the force (e.g., in the downward direction as indicated by arrow 315) exerted on device assembly 100 by member 130 may reduce the stress on portion 360 of release layer 130. As such, embodiments of the present invention can increase the amount of release layer 130 etched by fluid 350 before separation of substrate 110 and device sub-assembly 170, thereby reducing damage (e.g., tearing, breaking, etc.) to device 120 and/or at least one layer 140 which could otherwise result from an inadvertent separation or breaking of portion 360 (e.g., if member 310 were not used to relieve stresses imparted on portion 360).

Figure 5:
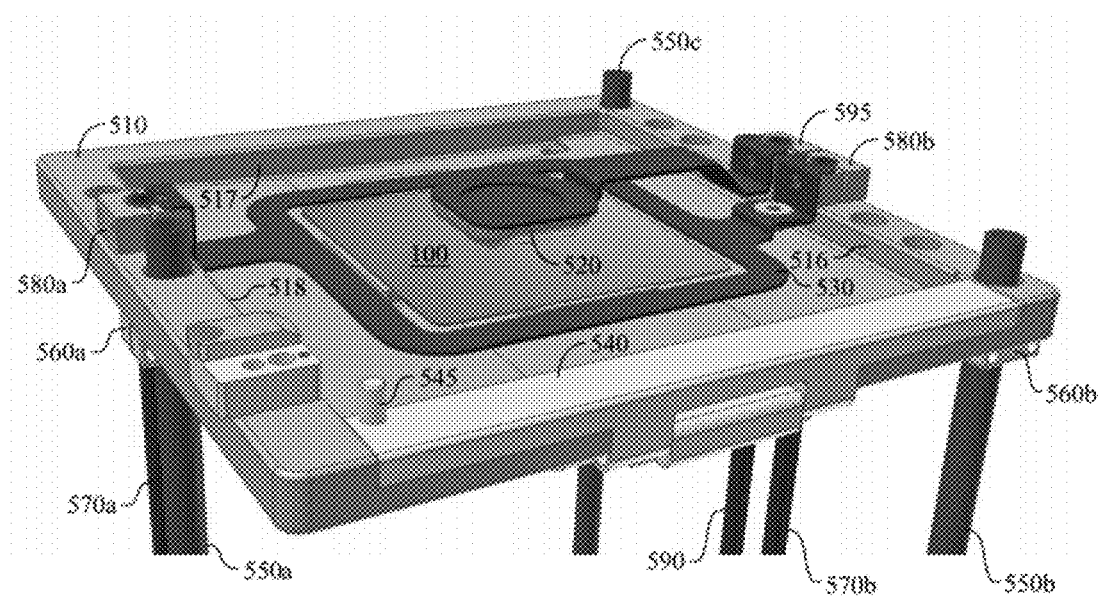
FIG. 5 shows an exemplary apparatus for performing epitaxial lift off in accordance with one embodiment of the present invention.
Figure 6:
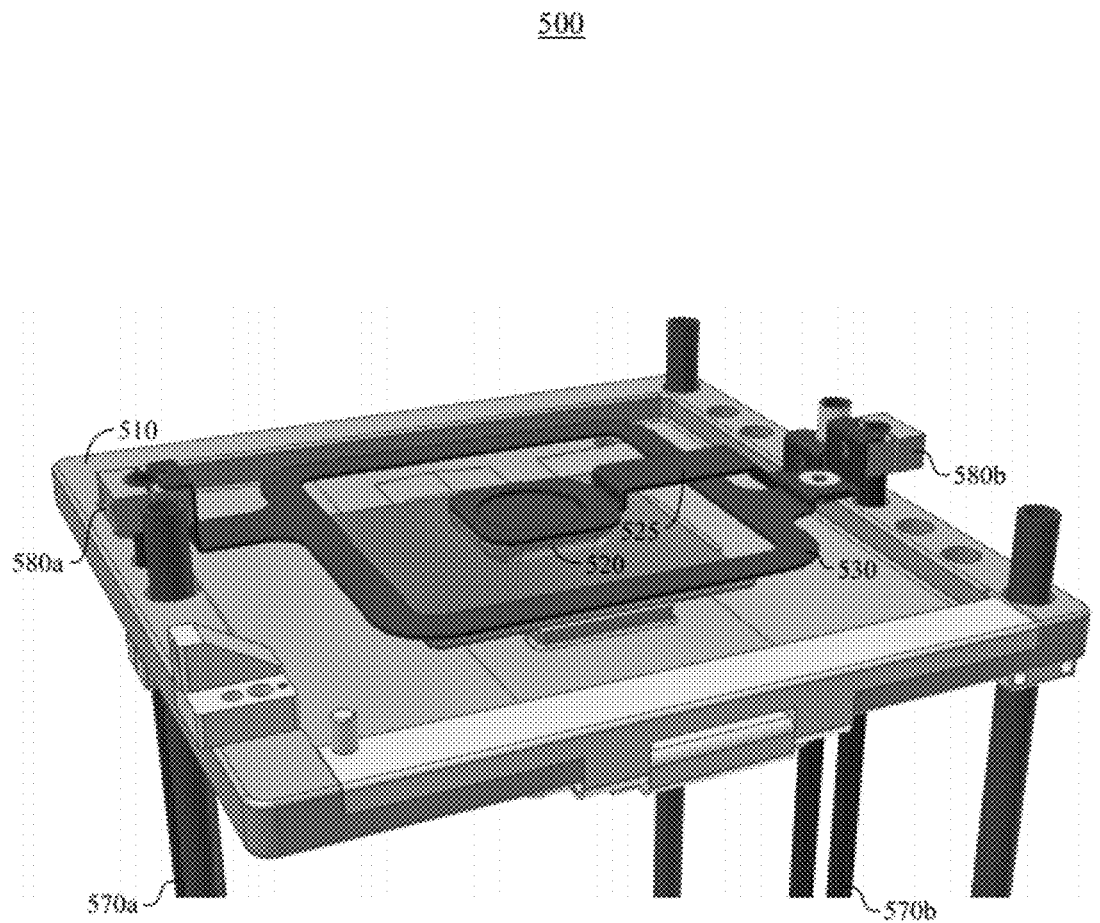
FIG. 6 shows an exemplary apparatus with a member in a raised position in accordance with one embodiment of the present invention.

In one embodiment, members 320 and 330 may be integrated into a single component. For example, members 320 and 330 may be part of a hoop (e.g., member 530 as shown in FIG. 5 and FIG. 6) or other structure used to apply a bending load to device assembly 100. At least a portion of the hoop may come into contact with at least a portion of region 220 around at least one other layer of device assembly 100 (e.g., substrate 110, release layer 130, device 120, at least one layer 140, adhesive layer 160, etc.). As such, in one embodiment, members 320 and 330 may be connected such that they move together.

Members 320 and 330 may be separate members and/or be capable of moving independently of one another in one embodiment. For example, members 320 and 330 may be separate members (e.g., member 931 of FIG. 9, member 932 of FIG. 9, member 933 of FIG. 9, member 934 of FIG. 9, member 935 of FIG. 9, member 936 of FIG. 9, member 937 of FIG. 9, member 938 of FIG. 9, etc.) used to apply a bending load to device assembly 100. Each member may come into contact with a different portion of bottom surface 154 of film 150 (e.g., within region 220) around at least one other layer of device assembly 100 (e.g., substrate 110, release layer 130, device 120, at least one layer 140, adhesive layer 160, etc.). In one embodiment, members 320 and 330 may be moved at different rates, over different distances, using different forces, some combination thereof, etc. In this manner, the movement of each member can be individually controlled to vary the stresses in different portions of device assembly 100, control the etch rate of different portions of release layer 130, etc.

As shown in FIG. 3, fluid 350 may be disposed on and/or directed toward release layer 130 to enable etching thereof. Fluid 350 may be pooled around device 100, sprayed or otherwise directed toward release layer 130, some combination thereof, etc. And in one embodiment, fluid 350 may be hydrofluoric acid (HF).

Although FIG. 3 depicts device assembly 100 with a particular number, size, and shape of layers, it should be appreciated that device assembly 100 may include a different number, size and/or shape of layers in other embodiments. Additionally, although FIG. 3 depicts device assembly 100 with a particular arrangement or ordering of layers, it should be appreciated that device assembly 100 may include a different arrangement or ordering of layers in other embodiments.

Figure 4:
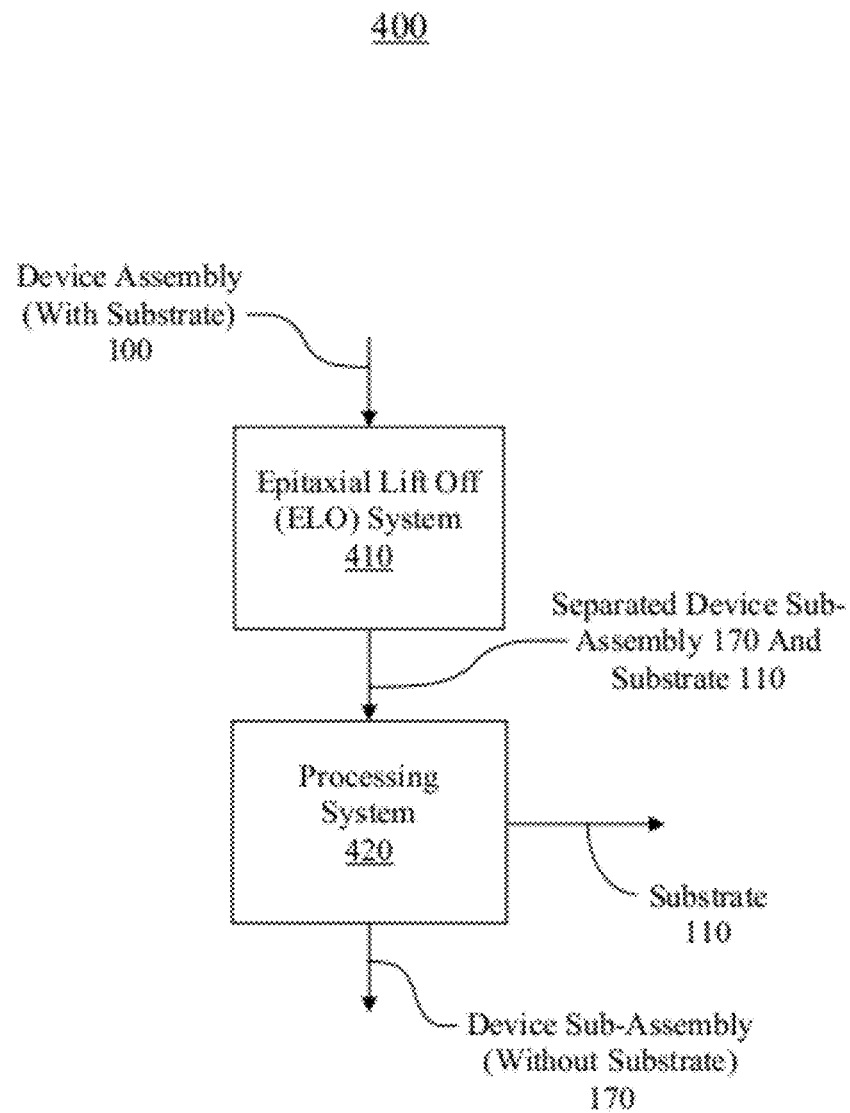
FIG. 4 shows an exemplary system for preparing device assemblies in accordance with one embodiment of the present invention.

FIG. 4 shows exemplary system 400 for preparing device assemblies in accordance with one embodiment of the present invention. As shown in FIG. 4, ELO system 410 may receive device assemblies with substrates (e.g., 100) and perform ELO to separate the substrates from the device assemblies. The separated device assemblies and substrates (e.g., 415) may be output from ELO system 410.

In one embodiment, ELO system 410 may include an apparatus (e.g., as depicted in FIGS. 5-14) for contemporaneously etching a plurality of device assemblies in a stacked arrangement. The apparatus may be disposed at least partially within a tank (e.g., tank 1170 of FIG. 11). Additionally, ELO system 410 may include actuators for moving members of the apparatus. For example, a first actuator may contemporaneously move members which clamp the device assemblies to trays of the apparatus, a second actuator may contemporaneously move members which apply bending loads to the device assemblies, a third actuator may contemporaneously move components which apply fluid 350 to the device assemblies for etching and/or enable fluid 350 to flow away from the device assemblies, etc.

As shown in FIG. 4, processing system 420 may receive the separated device sub-assemblies (e.g., 170) and substrates (e.g., 110) and perform one or more operations thereon. For example, processing system 420 may clean the separated device sub-assemblies (e.g., 170) and/or substrates (e.g., 110), rinse the separated device sub-assemblies (e.g., 170) and/or substrates (e.g., 110), dry the separated device sub-assemblies (e.g., 170) and/or substrates (e.g., 110), perform another operation on the separated device sub-assemblies (e.g., 170) and/or substrates (e.g., 110), some combination thereof, etc. As another example, processing system 420 may remove the substrates (e.g., 110) and/or the device sub-assemblies (e.g., 170) from the trays of the apparatus. Once the processing has been completed, the substrates (e.g., 110) and device sub-assemblies (e.g., 170) may be output for reuse (e.g., the substrates may be used to produce other device assemblies and/or device sub-assemblies), for further processing, for storage, etc.

In one embodiment, processing system 420 may receive the apparatus (e.g., 500 of FIG. 5, 800 of FIG. 8, 900 of FIG. 9, 1000 of FIG. 10, etc.) holding the separated device sub-assemblies (e.g., 170) and substrates (e.g., 110) from ELO system 410. For example, the one or more operations (e.g., cleaning, rinsing, drying, etc.) performed on the substrates (e.g., 110) and/or device sub-assemblies (e.g., 170) may be performed while the substrates and/or device sub-assemblies remain in the trays of the apparatus. As another example, the substrates (e.g., 110) may be removed from trays of the apparatus by a robot (e.g., with a mechanism for grasping the substrates, with a vacuum pick-up system capable of holding the substrates, etc.), with compressed air (e.g., capable of blowing the substrates out of the trays while leaving the device sub-assemblies in the trays), etc. In this manner, embodiments of the present invention can more efficiently transport or otherwise process a plurality of device sub-assemblies and/or substrates from one station to the next with fewer operations.

In one embodiment, the substrates (e.g., 110) and device sub-assemblies (e.g., 170) may be processed (e.g., cleaned, rinsed, dried, etc.) before removing the substrates (e.g., 110) and/or device sub-assemblies (e.g., 170) from the trays of the apparatus. The substrates (e.g., 110) and device sub-assemblies (e.g., 170) may be processed (e.g., cleaned, rinsed, dried, etc.) after removing the substrates (e.g., 110) and/or device sub-assemblies (e.g., 170) from the trays of the apparatus in one embodiment. And in one embodiment, the substrates (e.g., 110) and device sub-assemblies (e.g., 170) may be processed (e.g., cleaned, rinsed, dried, etc.) both before and after removing the substrates (e.g., 110) and/or device sub-assemblies (e.g., 170) from the trays of the apparatus.

Although FIG. 4 depicts system 400 with a particular number of systems (e.g., 410 and 420), it should be appreciated that system 400 may include a different number of systems in other embodiments. Additionally, although FIG. 4 depicts system 400 with a particular arrangement or ordering of systems, it should be appreciated that system 400 may include a different arrangement or ordering of systems in other embodiments.

FIG. 5 shows exemplary apparatus 500 for performing ELO in accordance with one embodiment of the present invention. As shown in FIG. 5, apparatus 500 includes tray 510 for accepting a device assembly (e.g., 100). Member 520 may be lowered to clamp the device assembly (e.g., 110) to tray 510. A bending load may be applied to the device assembly by raising member 530 (e.g., which may contact region 220 of bottom surface 154 of film 150). A release layer (e.g., 130) of the device assembly may be etched to separate the substrate (e.g., 110) from the device sub-assembly (e.g., 170). Thereafter, member 520 and/or 530 may be raised and the substrate (e.g., 110) and/or device sub-assembly (e.g., 170) may be removed from the apparatus. In one embodiment, the substrate (e.g., 110) and/or device sub-assembly (e.g., 170) may remain in apparatus for further processing (e.g., cleaning, rinsing, drying, some combination thereof, etc.).

Components 550a, 550b and 550c may extend through holes in tray 510. Tray 510 may rest on one or more components (e.g., 560a, 560b, etc.) which are clamped to or otherwise attached to components 550a, 550b and 550c. The components (e.g., 560a, 560b, etc.) may be used to control the height of tray 510 and/or the spacing between tray 510 and at least one other tray. In this manner, multiple trays can be advantageously placed in a stacked arrangement (e.g., on components 550a, 550b and 550c) for contemporaneously etching multiple device assemblies, thereby increasing the number of device assemblies that can be etched per unit area, increasing the number of device assemblies that can be etched per unit time (e.g., resulting in an increased yield), reducing cost or capital expenditure, some combination thereof, etc.

As shown in FIG. 5, member 530 may be coupled with component 570a and/or component 570b. In one embodiment, one side of member 530 may be secured to component 580a, where component 580a may be clamped on or otherwise attached to component 570a. And in one embodiment, the other side of member 530 may be secured to component 580b, where component 580b may be clamped on or otherwise attached to component 570b. Accordingly, movement or articulation of at least one component (e.g., 570a, 570b, etc.) with respect to tray 510 may move member 530 with respect to tray 510, thereby enabling member 530 to be moved contemporaneously with other members (e.g., similar to member 530 and used to apply bending loads to other device assemblies disposed in other trays) which are also coupled with the at least one component (e.g., 570a, 570b, etc.).

FIG. 6 shows exemplary apparatus 500 with member 530 in a raised position in accordance with one embodiment of the present invention. As shown in FIG. 6, member 530 may be raised (e.g., by moving or articulating component 570a and/or or 570b) to apply a bending load to a device assembly (e.g., 100). Member 520 may include an offset portion (e.g., 525) to reduce interference between members 520 and 530 when member 530 is in a raised position. In one embodiment, offset portion 525 may be formed by one or more bends in member 520.

Turning back to FIG. 5, member 520 may be coupled with component 590. In one embodiment, member 520 may be secured to component 595, where component 595 may be clamped on or otherwise attached to member 590. In this manner, movement or articulation of a component (e.g., 590) with respect to tray 510 may move member 520 with respect to tray 510, thereby enabling member 520 to be moved contemporaneously with other members (e.g., similar to member 520 and used to clamp other device assemblies to other trays) which are also coupled with the component (e.g., 590).

As shown in FIG. 5, member 530 may be advantageously shaped to increase the surface area of member 530 in contact with film 150 (e.g., region 220 of bottom surface 154). In one embodiment, member 530 may be hoop shaped. In this manner, embodiments of the present invention may reduce localized stress on film 150 and/or enable more uniform etching of the release layer (e.g., 130) of the device assembly (e.g., 100).

Figure 7:
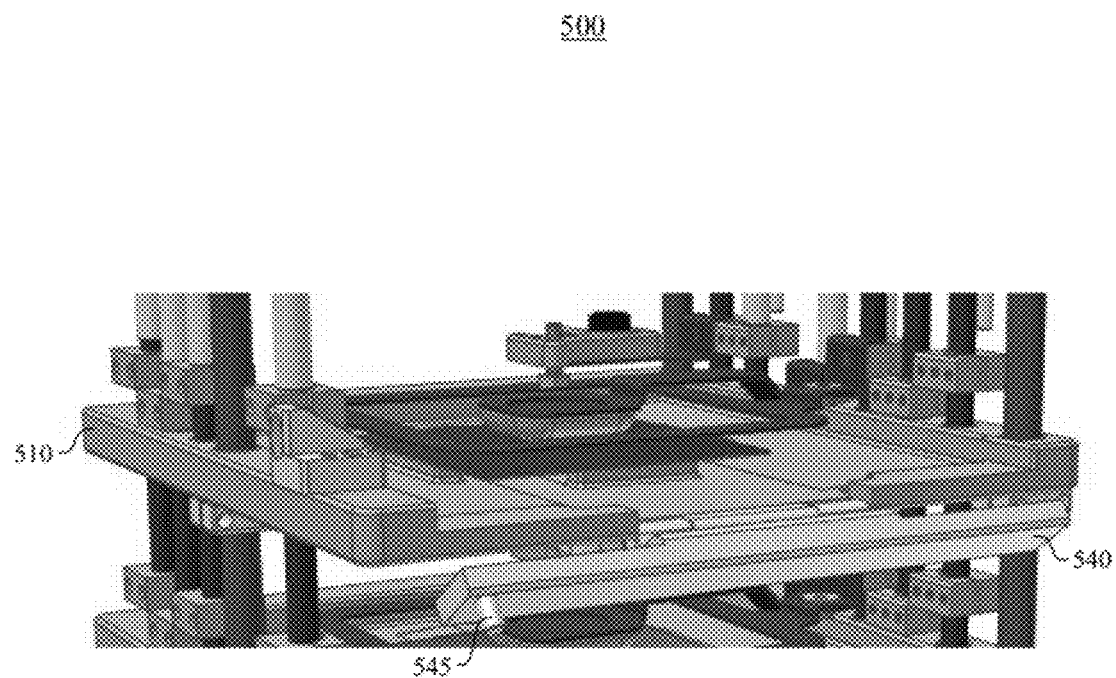
FIG. 7 shows an exemplary apparatus with a member in a position enabling fluid to flow away from a device assembly in accordance with one embodiment of the present invention.

Member 540 may be used to apply fluid (e.g., 350) to the release layer (e.g., 130) of the device assembly (e.g., 100) when in a first position (e.g., as shown in FIGS. 5 and 6). For example, fluid may be pooled and/or contained in tray 510 by the sidewalls of tray 510 (e.g., sidewalls 516, 517 and 518) and member 540 in the first position (e.g., responsive to a submerging of the tray and/or apparatus in the fluid, responsive to a directing of the fluid toward or into the tray, etc.). Alternatively, member 540 may be used to enable fluid (e.g., 350) to flow away from the release layer (e.g., 130) of the device assembly (e.g., 100) when in a second position (e.g., as shown in FIG. 7). In this manner, member 540 may be placed in the first position during etching and placed in the second position after etching.

Member 540 may be rotatably coupled to tray 510 in one embodiment. Member 540 may be automatically moved between the first and second positions using feature 545 in one embodiment. For example, a component (e.g., moved by an actuator, robot, etc.) may interface with feature 545 to rotate member 540 between positions. In one embodiment, the component that interfaces with feature 545 may also interface with similar features on other members (e.g., similar to member 540 and used to pool fluid around other device assemblies and/or enable fluid to flow away from other device assemblies). And in one embodiment, member 540 may be placed in the second position (e.g., as shown in FIG. 7) to enable removal of the substrate (e.g., 110) and/or device sub-assembly (e.g., 170) after separation.

In one embodiment, tray 510 may include components (e.g., hoses, features for redirecting a flow of fluid, etc.) for spraying or otherwise directing the fluid (e.g., 350) toward the release layer (e.g., 130) of the device assembly (e.g., 100).

And in one embodiment, tray 510 may also include clamps or other features for holding or securing hoses or other components used to spray or otherwise direct the fluid (e.g., 350) toward the release layer (e.g., 130) of the device assembly (e.g., 100).

Although FIGS. 5, 6 and 7 show apparatus 500 with a specific number of components, it should be appreciated that apparatus 500 may include a different number of components in other embodiments. For example, apparatus 500 may include multiple members similar to (e.g., in shape, size, function, some combination thereof, etc.) member 520, multiple members similar to (e.g., in shape, size, function, some combination thereof, etc.) member 530, multiple members similar to (e.g., in shape, size, function, some combination thereof, etc.) member 540, some combination thereof, etc. Additionally, although FIGS. 5, 6 and 7 show apparatus 500 with a specific size and shape of components, it should be appreciated that apparatus 500 may include a different size and/or shape of components in other embodiments. Further, although FIGS. 5, 6 and 7 show apparatus 500 with a specific configuration of components, it should be appreciated that apparatus 500 may include a different configuration of components in other embodiments. For example, tray 510 may be capable of holding and/or etching more than one device assembly (e.g., similar to device assembly 100).

Figure 8:
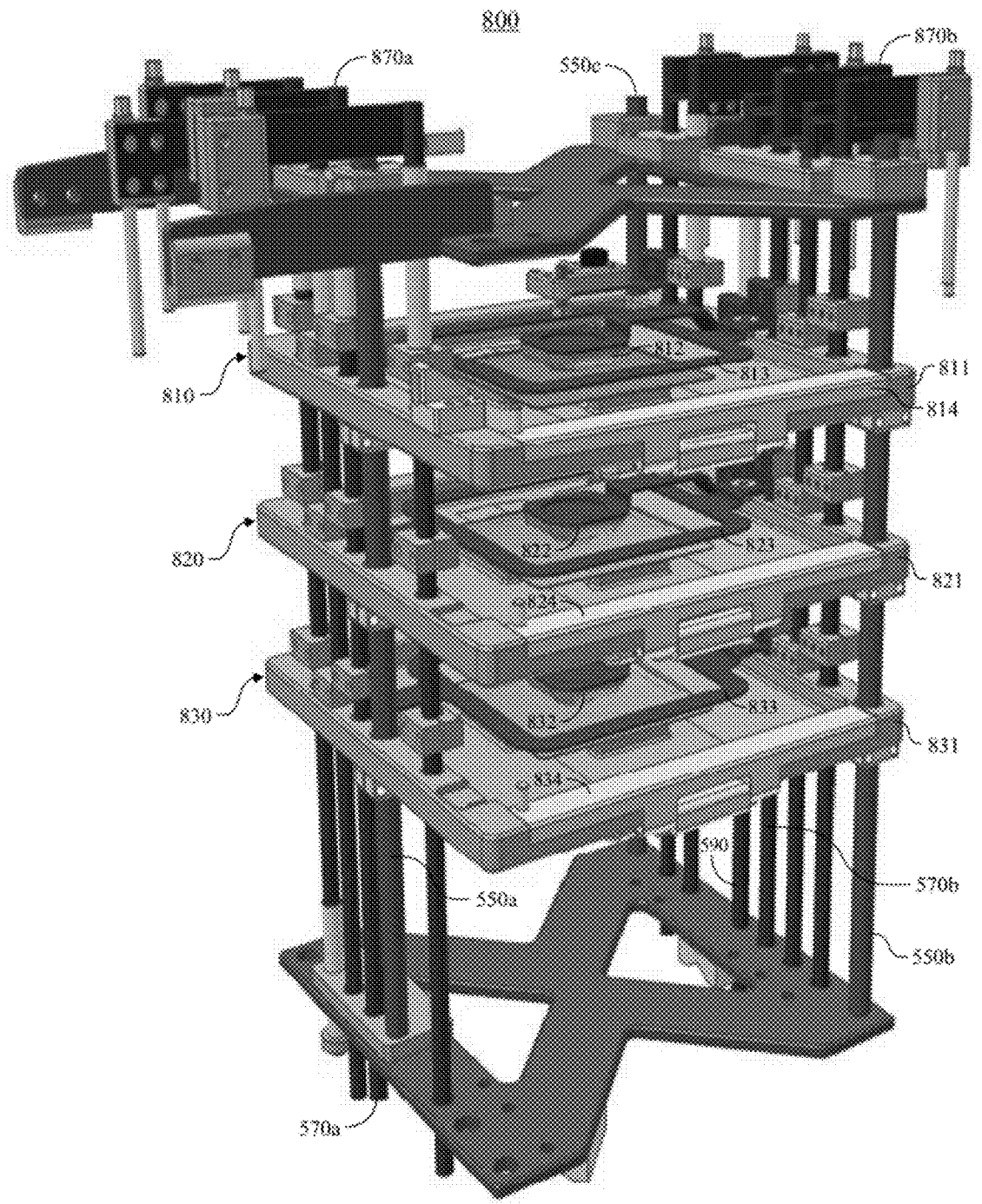
FIG. 8 shows an exemplary apparatus for performing epitaxial lift off on a plurality of device assemblies in a stacked arrangement in accordance with one embodiment of the present invention.

FIG. 8 shows exemplary apparatus 800 for performing ELO on a plurality of device assemblies in a stacked arrangement in accordance with one embodiment of the present invention. As shown in FIG. 8, apparatus 800 includes assembly 810, assembly 820 and assembly 830, where each of the assemblies includes a respective first member (e.g., 812, 822, and 832, respectively) for clamping a respective device assembly (e.g., 100) to a respective tray (e.g., 811, 821, and 831, respectively), a respective second member (e.g., 813, 823, and 833, respectively) for applying a bending load to a respective device assembly (e.g., 100), and a respective third member (e.g., 814, 824, and 834, respectively) for applying fluid to and/or directing fluid away from a respective device assembly (e.g., 100) for etching a respective release layer (e.g., 130) to separate a respective substrate (e.g., 110) from a respective device sub-assembly (e.g., 170). In one embodiment, one or more of the assemblies of apparatus 800 (e.g., assembly 810, assembly 820, assembly 830, etc.) may be implemented in accordance with apparatus 500. In this manner, a plurality of device assemblies can be contemporaneously etched in stacked arrangement to increase the number of device assemblies that can be etched per unit area, increase the number of device assemblies that can be etched per unit time (e.g., resulting in an increased yield), reduce cost or capital expenditure, some combination thereof, etc.

As shown in FIG. 8, respective members of each assembly may be coupled with a common component to enable contemporaneous movement of the respective members by articulating the component (e.g., instead of individually moving each respective member using a separate component). For example, members 812, 822 and 832 may be coupled with component 590, and therefore, component 590 may be articulated (e.g., moved upward with respect to at least one other component of apparatus 800, moved downward with respect to at least one other component of apparatus 800, etc.) to contemporaneously move members 812, 822 and 832. As another example, members 813, 823 and 833 may be coupled with components 570a and 570b, and therefore, components 570a and 570b may be articulated (e.g., moved upward with respect to at least one other component of apparatus 800, moved downward with respect to at least one other component of apparatus 800, etc.) to contemporaneously move members 813, 823 and 833. As yet another example, members 814, 824 and 834 may interface with a common component (not shown) which is capable of contemporaneously moving members 814, 824 and 834 (e.g., between a first position and a second position). Accordingly, embodiments of the present invention can perform ELO on a plurality of device assemblies with a reduced number of components, thereby reducing the failure rate of the system, the cost of the system, some combination thereof, etc.

In one embodiment, each of the components (e.g., 570a, 570b, 590, etc.) used to move the members (e.g., 812, 822, 832, 813, 823, 833, 814, 824, 834, etc.) may be coupled with a respective component for offsetting or otherwise changing the point of articulation. For example, component 570a may be coupled with component 870a, and component 570b may be coupled with component 870b. As such, articulation of component 870a and/or component 870b may contemporaneously move members 813, 823 and 833.

In one embodiment, a plurality of components of apparatus 800 may be made from the same material or different materials with the similar (or the same) coefficients of thermal expansion. For example, components (e.g., 550a, 550b, 550c, etc.) used to space and/or support the trays (e.g., 811, 821, 831, etc.) may be made from the same material or different materials with the similar (or the same) coefficients of thermal expansion as at least one component (e.g., 590, etc.) used to move clamping members (e.g., 812, 822, 832, etc.), at least one component (e.g., 570a, 570b, etc.) used to move bending members (e.g., 813, 823, 833, etc.), at least one component used to move another respective member of each assembly (e.g., 810, 820, 830, etc.), some combination thereof, etc. In this manner, the height or positioning of a respective member (e.g., 812, 822, 832, 813, 823, 833, 814, 824, 834, etc.) with respect to each tray (e.g., 811, 821, 831, etc.) may be substantially maintained regardless of thermal expansion (e.g., due to heating of apparatus 800) and/or thermal contraction (e.g., due to cooling of apparatus 800).

Although FIG. 8 shows apparatus 800 with a specific number of components, it should be appreciated that apparatus 800 may include a different number of components in other embodiments. For example, apparatus 800 may include a different number of assemblies in other embodiments. As another example, each assembly of apparatus 800 (e.g., assembly 810, assembly 820, assembly 830, etc.) may include multiple clamping members (e.g., 812, 822, 832, etc.), multiple bending members (e.g., 813, 823, 833, etc.), multiple members used to direct fluid toward and/or away from a respective device assembly (e.g., 814, 824, 834, etc.), some combination thereof, etc. Additionally, although FIG. 8 shows apparatus 800 with a specific size and shape of components, it should be appreciated that apparatus 800 may include a different size and/or shape of components in other embodiments. Further, although FIG. 8 shows apparatus 800 with a specific configuration of components, it should be appreciated that apparatus 800 may include a different configuration of components in other embodiments. For example, apparatus 800 may include at least one tray (e.g., similar to tray 811, tray 821, tray 831, etc.) capable of holding and/or etching more than one device assembly (e.g., similar to device assembly 100).

Figure 9:
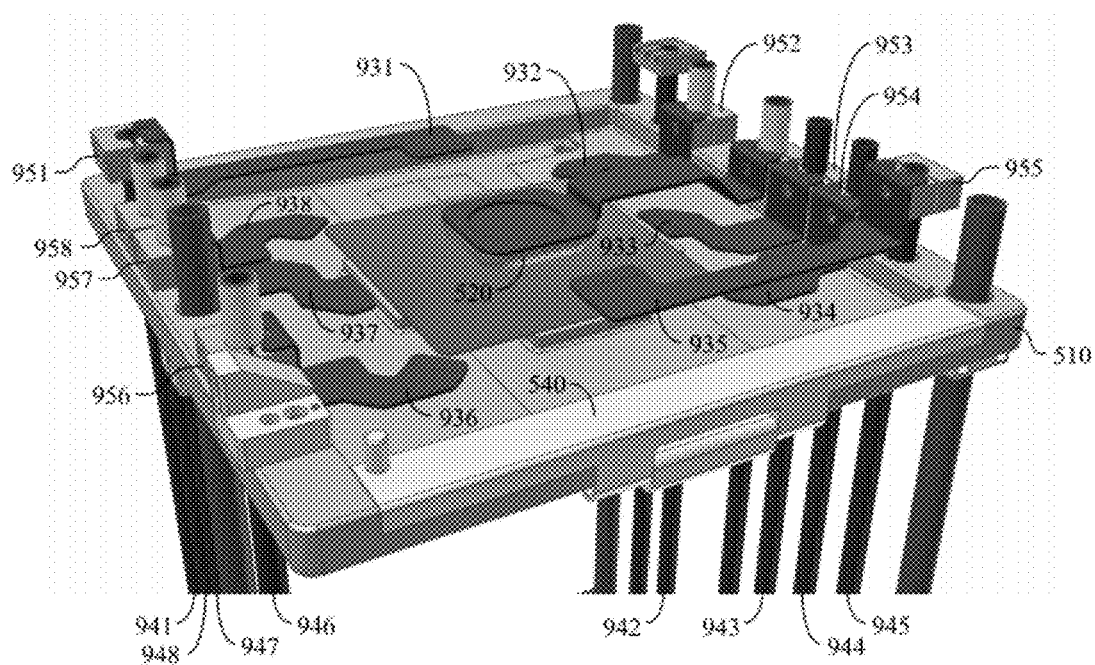
FIG. 9 shows an exemplary apparatus for performing epitaxial lift off with multiple bending members in accordance with one embodiment of the present invention.

FIG. 9 shows exemplary apparatus 900 for performing ELO with multiple bending members in accordance with one embodiment of the present invention. As shown in FIG. 9, apparatus 900 includes multiple members (e.g., 931, 932, 933, 934, 935, 936, 937, 938, etc.) which are separate and/or capable of being moved independently of one another, where each of the members may be used to apply a bending load to a device assembly (e.g., 100). For example, where a device assembly (e.g., 100) is clamped to tray 510 (e.g., by member 520), each member may be moved upward to contact a different portion of bottom surface 154 of film 150 (e.g., within region 220) and apply a bending load thereto. The at least one bending load applied using one or more of the members (e.g., 931, 932, 933, 934, 935, 936, 937, 938, etc.) may be used to separate a substrate (e.g., 110) from a device sub-assembly (e.g., 170) via etching a release layer (e.g., 130) of the device assembly (e.g., 100). In one embodiment, each of the bending members (e.g., 931-938) may be moved at a different rate, over a different distance, using different forces, some combination thereof, etc. In this manner, the movement of each member can be individually controlled to vary the stresses in different portions of the device assembly (e.g., 100), control the etch rate of different portions of the release layer (e.g., 130), etc.

As shown in FIG. 9, each member (e.g., 931, 932, 933, 934, 935, 936, 937, 938, etc.) may be coupled with a separate or different component. For example, member 931 may be coupled with component 941, member 932 may be coupled with component 942, member 933 may be coupled with component 943, member 934 may be coupled with component 944, member 935 may be coupled with component 945, member 936 may be coupled with component 946, member 937 may be coupled with component 947, and member 938 may be coupled with component 948. Accordingly, movement or articulation of a component (e.g., 941, 942, 943, 944, 945, 946, 947, 948, etc.) with respect to tray 510 may move a member (e.g., 931, 932, 933, 934, 935, 936, 937, 938, etc.) with respect to tray 510, thereby enabling each member to be moved independently of at least one other member (e.g., members 931 and 935 are raised, whereas the other members are lowered).

In one embodiment, each member (e.g., 931, 932, 933, 934, 935, 936, 937, and 938) may be coupled with a respective component (e.g., 941, 942, 943, 944, 945, 946, 947, 948, respectively) via at least one other respective component (e.g., 951, 952, 953, 954, 955, 956, 957, 958, respectively). Each of the members may be secured to one of the other respective components (e.g., via at least one screw or some other attachment mechanism), where each of the other respective components (e.g., 951, 952, 953, 954, 955, 956, 957, 958, etc.) is clamped on or otherwise attached to a respective component (e.g., 941, 942, 943, 944, 945, 946, 947, 948, etc.).

Although FIG. 9 shows apparatus 900 with a specific number of components, it should be appreciated that apparatus 900 may include a different number of components in other embodiments. For example, apparatus 900 may include multiple members similar to (e.g., in shape, size, function, some combination thereof, etc.) member 520, a different number of members similar to (e.g., in shape, size, function, some combination thereof, etc.) a bending member (e.g., 931, 932, 933, 934, 935, 936, 937, 938, etc.), multiple members similar to (e.g., in shape, size, function, some combination thereof, etc.) member 540, some combination thereof, etc. Additionally, although FIG. 9 shows apparatus 900 with a specific size and shape of components, it should be appreciated that apparatus 900 may include a different size and/or shape of components in other embodiments. Further, although FIG. 9 shows apparatus 900 with a specific configuration of components, it should be appreciated that apparatus 900 may include a different configuration of components in other embodiments. For example, tray 510 may be capable of holding and/or etching more than one device assembly (e.g., similar to device assembly 100).

Figure 10:
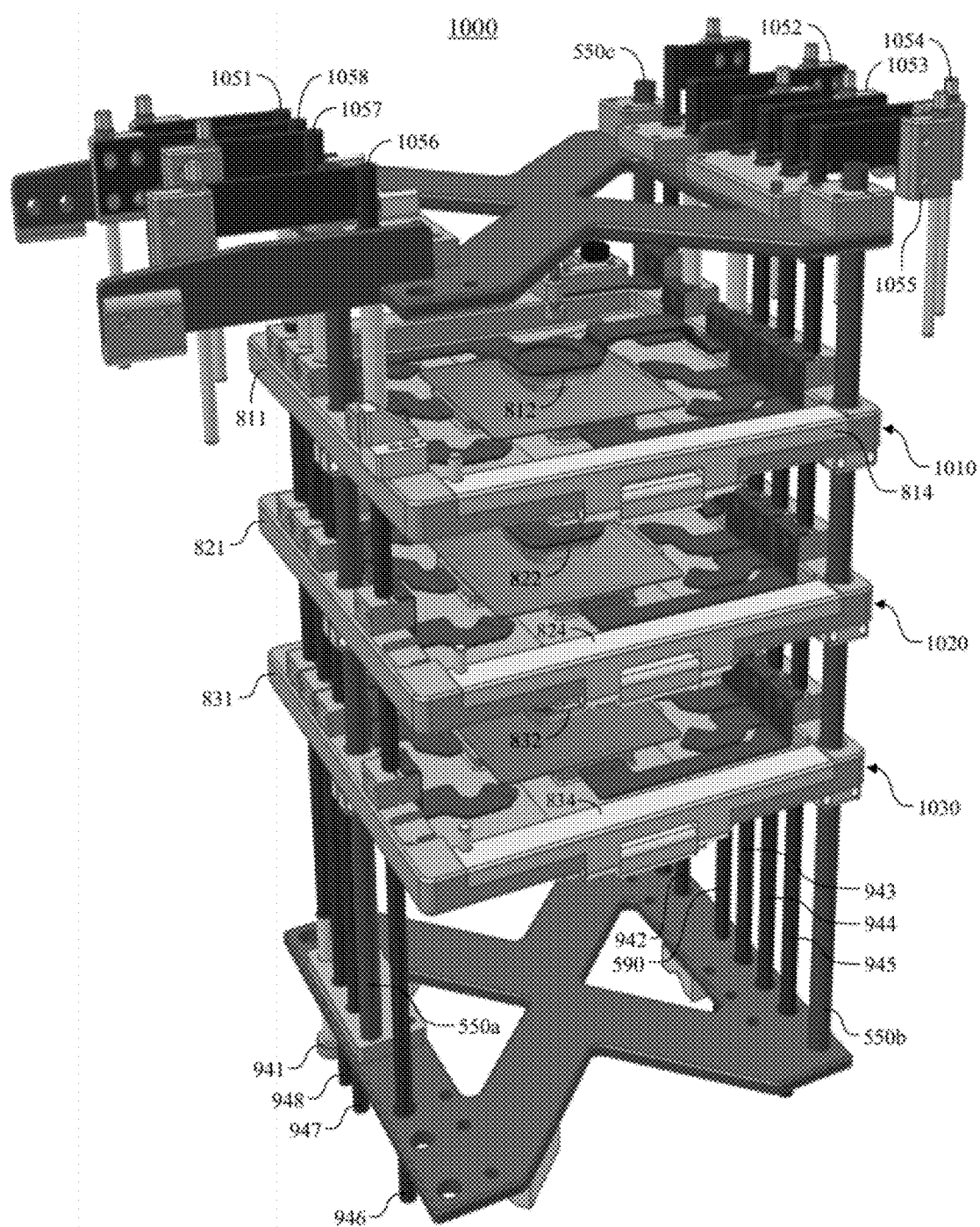
FIG. 10 shows an exemplary apparatus for performing epitaxial lift off on a plurality of device assemblies in a stacked arrangement using multiple bending members in accordance with one embodiment of the present invention.

FIG. 10 shows exemplary apparatus 1000 for performing ELO on a plurality of device assemblies in a stacked arrangement using multiple bending members in accordance with one embodiment of the present invention. As shown in FIG. 10, apparatus 1000 includes assembly 1010, assembly 1020 and assembly 1030, where each of the assemblies includes a respective first member (e.g., 812, 822, and 832, respectively) for clamping a respective device assembly (e.g., 100) to a respective tray (e.g., 811, 821, and 831, respectively), a respective plurality of second members (e.g., similar to members 931-938) for applying at least one bending load to a respective device assembly (e.g., 100), and a respective third member (e.g., 814, 824, and 834, respectively) for applying fluid to and/or directing fluid away from a respective device assembly (e.g., 100) for etching a respective release layer (e.g., 130) to separate a respective substrate (e.g., 110) from a respective device sub-assembly (e.g., 170). In one embodiment, one or more of the assemblies of apparatus 1000 (e.g., assembly 1010, assembly 1020, assembly 1030, etc.) may be implemented in accordance with apparatus 900. In this manner, a plurality of device assemblies can be contemporaneously etched in stacked arrangement to increase the number of device assemblies that can be etched per unit area, increase the number of device assemblies that can be etched per unit time (e.g., resulting in an increased yield), reduce cost or capital expenditure, some combination thereof, etc.

As shown in FIG. 10, respective members of each assembly may be coupled with a common component to enable contemporaneous movement of the respective members by articulating the component (e.g., instead of individually moving each respective member using a separate component). For example, members 812, 822 and 832 may be coupled with component 590, and therefore, component 590 may be articulated (e.g., moved upward with respect to at least one other component of apparatus 1000, moved downward with respect to at least one other component of apparatus 1000, etc.) to contemporaneously move members 812, 822 and 832. As another example, each bending member (e.g., similar to members 931-938) of each assembly (e.g., 1010, 1020, 1030, etc.) may be coupled with a respective component (e.g., 941, 942, 943, 944, 945, 946, 947, 948, respectively), and therefore, each component (e.g., 941, 942, 943, 944, 945, 946, 947, 948, etc.) may be articulated (e.g., moved upward with respect to at least one other component of apparatus 1000, moved downward with respect to at least one other component of apparatus 1000, etc.) to contemporaneously move a respective plurality of members (e.g., members of each assembly similar to member 931, members of each assembly similar to member 932, members of each assembly similar to member 933, etc.) coupled therewith. As yet another example, members 814, 824 and 834 may interface with a common component (not shown) which is capable of contemporaneously moving members 814, 824 and 834 (e.g., between a first position and a second position). Accordingly, embodiments of the present invention can perform ELO on a plurality of device assemblies with a reduced number of components, thereby reducing the failure rate of the system, the cost of the system, some combination thereof, etc.

In one embodiment, each of the components (e.g., 941, 942, 943, 944, 945, 946, 947, 948, etc.) used to move the members (e.g., bending members of each assembly similar to 931-938, 812, 822, 832, 814, 824, 834, etc.) may be coupled with a respective component for offsetting or otherwise changing the point of articulation. For example, component 941 may be coupled with component 1051, component 942 may be coupled with component 1052, component 943 may be coupled with component 1053, component 944 may be coupled with component 1054, component 945 may be coupled with component 1055, component 946 may be coupled with component 1056, component 947 may be coupled with component 1057, component 948 may be coupled with component 1058, etc. As such, articulation of each component (e.g., 1051, 1052, 1053, 1054, 1055, 1056, 1057, 1058, etc.) may contemporaneously move a respective plurality of members (e.g., members of each assembly similar to member 931, members of each assembly similar to member 932, members of each assembly similar to member 933, etc.) coupled therewith.

In one embodiment, a plurality of components of apparatus 1000 may be made from the same material or different materials with the similar (or the same) coefficients of thermal expansion. For example, components (e.g., 550a, 550b, 550c, etc.) used to space and/or support the trays (e.g., 811, 821, 831, etc.) may be made from the same material or different materials with the similar (or the same) coefficients of thermal expansion as at least one component (e.g., 590, etc.) used to move clamping members (e.g., 812, 822, 832, etc.), at least one component (e.g., 1051, 1052, 1053, 1054, 1055, 1056, 1057, 1058, etc.) used to move bending members (e.g., members of each assembly similar to member 931, members of each assembly similar to member 932, members of each assembly similar to member 933, etc.), at least one component used to move another respective member of each assembly (e.g., 1010, 1020, 1030, etc.), some combination thereof, etc. In this manner, the height or positioning of a respective member (e.g., bending members of each assembly similar to 931-938, 812, 822, 832, 814, 824, 834, etc.) with respect to each tray (e.g., 811, 821, 831, etc.) may be substantially maintained regardless of thermal expansion (e.g., due to heating of apparatus 1000) and/or thermal contraction (e.g., due to cooling of apparatus 1000).

Although FIG. 10 shows apparatus 1000 with a specific number of components, it should be appreciated that apparatus 1000 may include a different number of components in other embodiments. For example, apparatus 1000 may include a different number of assemblies in other embodiments. As another example, each assembly of apparatus 1000 (e.g., assembly 1010, assembly 1020, assembly 1030, etc.) may include multiple clamping members (e.g., 812, 822, 832, etc.), a different number of bending members (e.g., similar to members 931-938), multiple members used to direct fluid toward and/or away from a respective device assembly (e.g., 814, 824, 834, etc.), some combination thereof, etc. Additionally, although FIG. 10 shows apparatus 1000 with a specific size and shape of components, it should be appreciated that apparatus 1000 may include a different size and/or shape of components in other embodiments. Further, although FIG. 10 shows apparatus 1000 with a specific configuration of components, it should be appreciated that apparatus 1000 may include a different configuration of components in other embodiments. For example, apparatus 1000 may include at least one tray (e.g., similar to tray 811, tray 821, tray 831, etc.) capable of holding and/or etching more than one device assembly (e.g., similar to device assembly 100).

Figure 11:
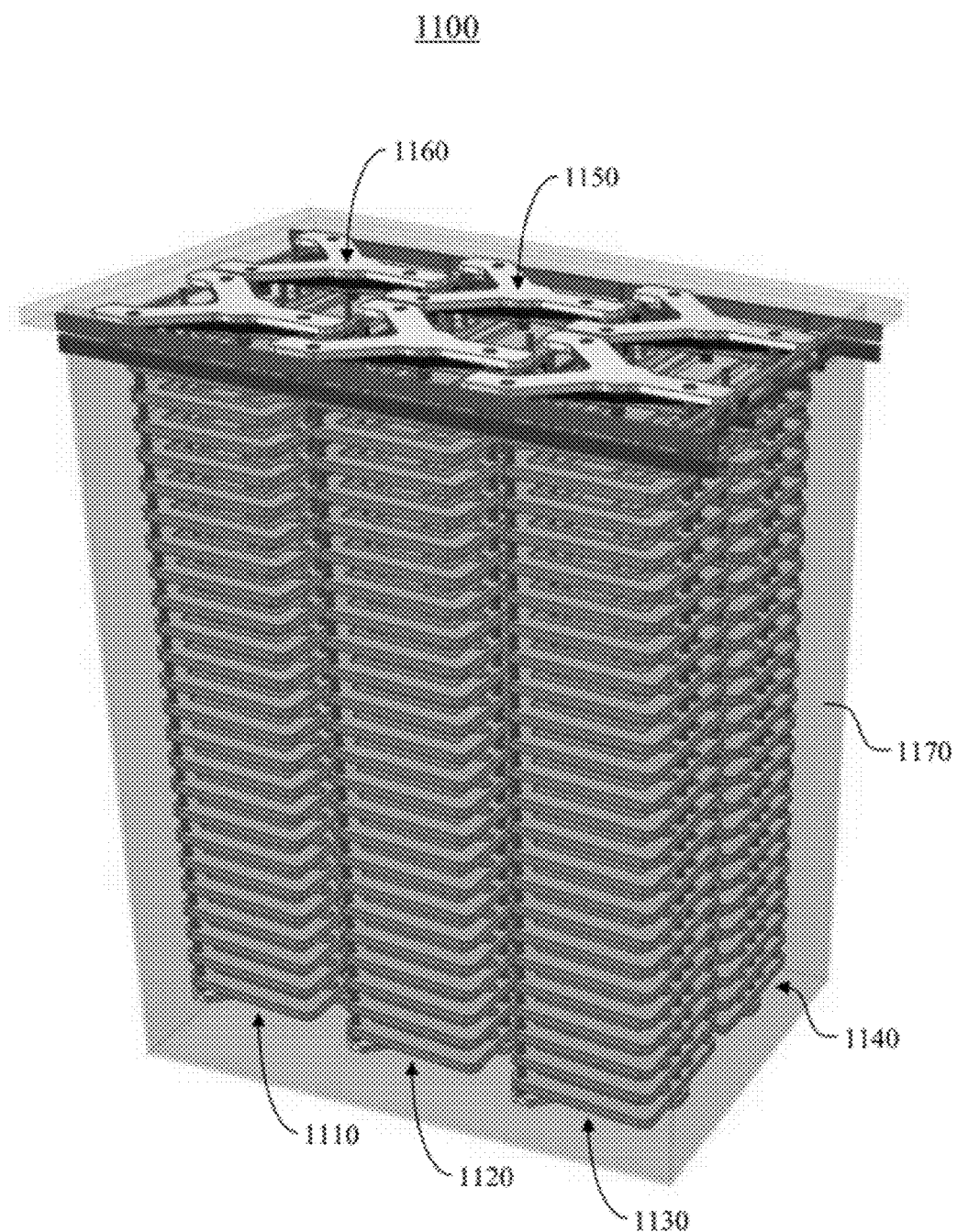
FIG. 11 shows an exemplary system for performing epitaxial lift off on a plurality of device assemblies in accordance with one embodiment of the present invention.

FIG. 11 shows exemplary system 1100 for performing ELO on a plurality of device assemblies in accordance with one embodiment of the present invention. As shown in FIG. 11, system 1100 includes a plurality of apparatuses (e.g., 1110, 1120, 1130, 1140, 1150 and 1160), where each apparatus may enable a plurality of device assemblies (e.g., similar to device assembly 100) to be contemporaneously etched in stacked arrangement. In one embodiment, each apparatus may be implemented in accordance with apparatus 500, apparatus 800, apparatus 900, apparatus 1000, some combination thereof, etc. And in one embodiment, system 1100 may be used to implement ELO system 410, processing system 420, some combination thereof, etc.

As shown in FIG. 11, each of the apparatuses (e.g., 1110, 1120, 1130, 1140, 1150 and 1160) may be positioned with respect to tank 1170 such that fluid (e.g., HF, another fluid, etc.) used to etch the device assemblies may be directed by tank 1170, contained within tank 1170, etc. In one embodiment, each of the apparatuses (e.g., 1110, 1120, 1130, 1140, 1150 and 1160) may be disposed at least partially within tank 1170, thereby enabling the fluid to be applied to the one or more device assemblies (e.g., by submerging the apparatus within fluid in tank 1170, by spraying or otherwise directing fluid to the one or more device assemblies held by the apparatus, etc.). And in one embodiment, tank 1170 may be made from a material resistant to HF or another fluid used to etch release layers (e.g., similar to release layer 130) of the device assemblies (e.g., similar to device assembly 100).

In one embodiment, at least one member and/or at least one component of one apparatus of system 1100 may be coupled with at least one member and/or at least one component of at least one other apparatus of system 1100. For example, at least one clamping member (e.g., similar to one or more of members 812, 822, 832, etc.) of apparatus 1110 may be coupled to at least one clamping member (e.g., similar to one or more of members 812, 822, 832, etc.) of at least one other apparatus (e.g., 1120, 1130, 1140, 1150 and 1160, etc.). As another example, at least one bending member (e.g., similar to one or more of members 813, 823, 833, 931-938, etc.) of apparatus 1110 may be coupled to at least one bending member (e.g., similar to one or more of members 813, 823, 833, 931-938, etc.) of at least one other apparatus (e.g., 1120, 1130, 1140, 1150 and 1160, etc.). As yet another example, at least one member used to direct fluid toward and/or away from a respective device assembly (e.g., similar to one or more of members 814, 824, 834, etc.) of apparatus 1110 may be coupled to at least one member used to direct fluid toward and/or away from a respective device assembly (e.g., similar to one or more of members 814, 824, 834, etc.) of at least one other apparatus (e.g., 1120, 1130, 1140, 1150 and 1160, etc.). In this manner, at least one respective member and/or at least one respective component of each of a plurality of apparatuses (e.g., 1110, 1120, 1130, 1140, 1150 and 1160, etc.) may be contemporaneously moved or articulated using a common actuator.

Accordingly, system 1100 can increase the number of device assemblies that can be etched per unit area (e.g., thereby reducing the size or footprint of tank 1170 for a given yield compared to conventional systems), increase the number of device assemblies that can be etched per unit time (e.g., resulting in an increased yield), reduce cost or capital expenditure, some combination thereof, etc. Additionally, embodiments of the present invention can perform ELO on a plurality of device assemblies with a reduced number of components, thereby reducing the failure rate of the system, the cost of the system, some combination thereof, etc.

Although FIG. 11 shows system 1100 with a specific number of components, it should be appreciated that system 1100 may include a different number of components in other embodiments. For example, system 1100 may include a different number of apparatuses, etc. Additionally, although FIG. 11 shows system 1100 with a specific size and shape of components, it should be appreciated that system 1100 may include a different size and/or shape of components in other embodiments.

Figure 12:
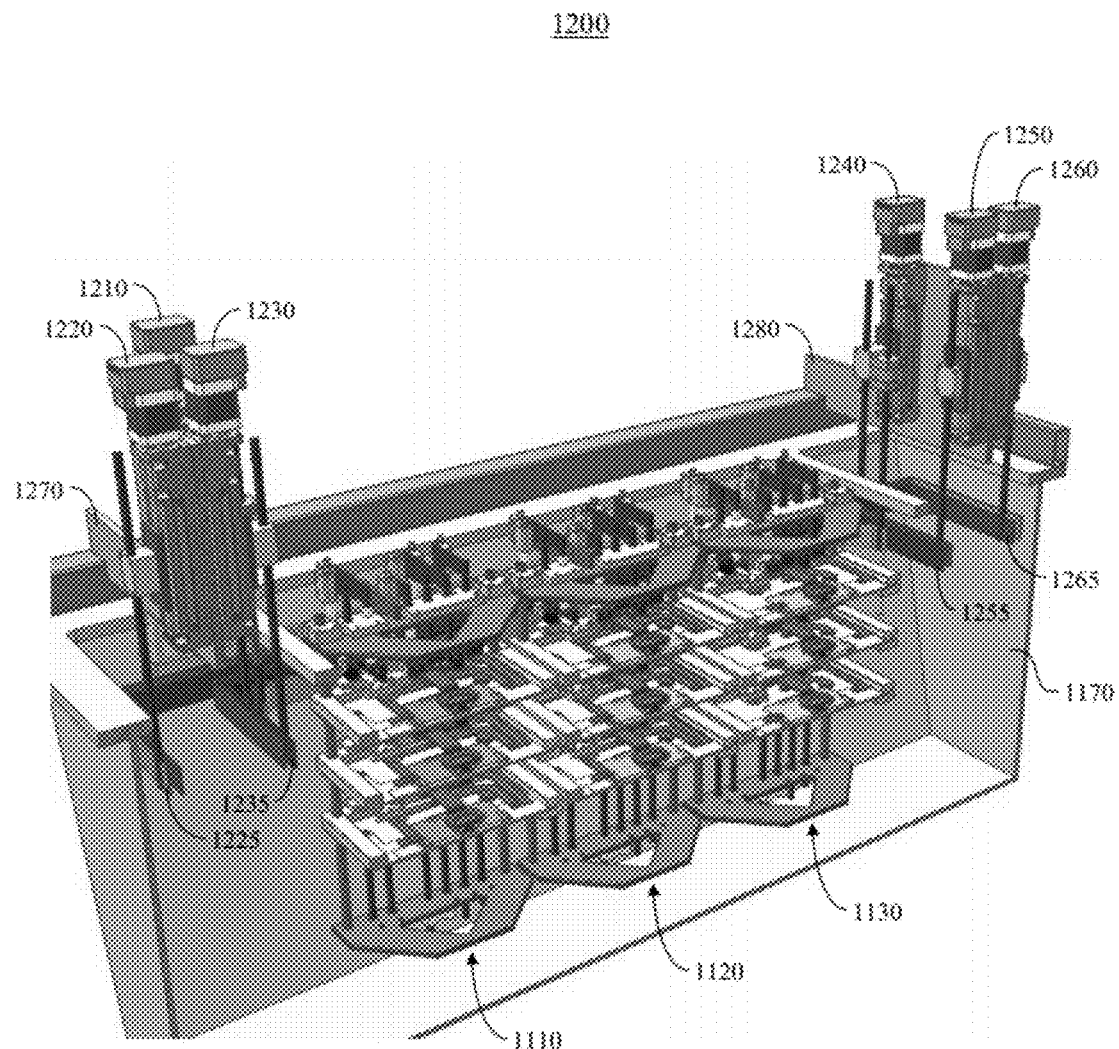
FIG. 12 shows an exemplary system for performing epitaxial lift off on a plurality of device assemblies with at least one actuator in accordance with one embodiment of the present invention.

FIG. 12 shows exemplary system 1200 for performing ELO on a plurality of device assemblies with at least one actuator in accordance with one embodiment of the present invention. As shown in FIG. 12, system 1200 includes a plurality of actuators (e.g., 1210, 1220, 1230, 1240, 1250, 1260, etc.), where each actuator may articulate or move a respective member and/or a respective component of each apparatus (e.g., 1110, 1120, 1130, etc.), of each assembly of each apparatus, etc. For example, actuator 1210 may move or articulate at least one clamping member of each apparatus, actuator 1220 may move or articulate at least one bending member of each apparatus, actuator 1230 may move or articulate at least one member of each apparatus used to for apply fluid to and/or direct fluid away from a respective device assembly, etc.

Each actuator may be coupled with at least one member and/or at least one component via at a respective component. For example, actuator 1220 may be coupled with at least one member and/or at least one component via component 1225, actuator 1230 may be coupled with at least one member and/or at least one component via component 1235, actuator 1250 may be coupled with at least one member and/or at least one component via component 1255, actuator 1260 may be coupled with at least one member and/or at least one component via component 1265, etc. In one embodiment, the components (e.g., 1225, 1235, 1255, 1265, etc.) may be routed or otherwise be disposed between tank 1170 and at least one apparatus (e.g., 1110, 1120, 1130, etc.).

As shown in FIG. 12, the actuators (e.g., 1210, 1220, 1230, 1240, 1250, 1260, etc.) may be coupled with one or more support members (e.g., 1270 and 1280). The support members (e.g., 1270 and 1280) may span tank 1170 in one embodiment.

In one embodiment, one or more of the actuators (e.g., 1210, 1220, 1230, 1240, 1250, 1260, etc.) may be pneumatic actuators and/or hydraulic actuators. In one embodiment, one or more of the actuators (e.g., 1210, 1220, 1230, 1240, 1250, 1260, etc.) may be stepper motor actuators. And in one embodiment, one or more of the actuators (e.g., 1210, 1220, 1230, 1240, 1250, 1260, etc.) may be another type of actuator.

In one embodiment, system 1200 may be used to implement one or more components of system 400. For example, system 1200 may be used to implement ELO system 410, substrate removal system 420, some combination thereof, etc.

Although FIG. 12 shows system 1200 with a specific number of components, it should be appreciated that system 1200 may include a different number of components in other embodiments. For example, system 1200 may include a different number of apparatuses, a different number of actuators, etc. Additionally, although FIG. 12 shows system 1200 with a specific size and shape of components, it should be appreciated that system 1200 may include a different size and/or shape of components in other embodiments.

Figure 13:
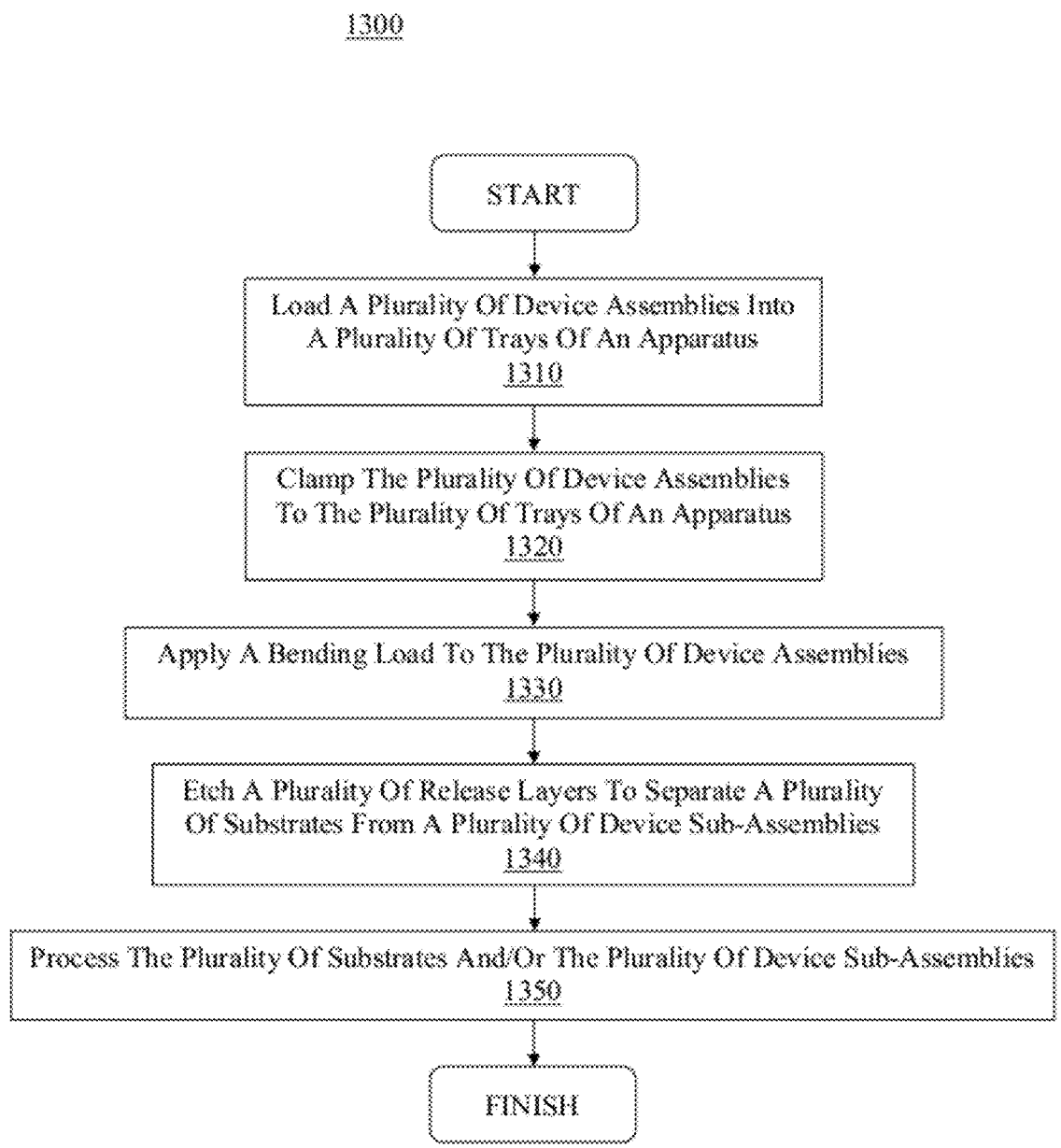
FIG. 13 shows a flowchart of an exemplary process for performing epitaxial lift off in accordance with one embodiment of the present invention.

FIG. 13 shows a flowchart of exemplary process 1300 for performing ELO in accordance with one embodiment of the present invention. As shown in FIG. 13, step 1310 involves loading a plurality of device assemblies (e.g., 100) into a plurality of trays (e.g., 510, 811, 821, 831, etc.) of an apparatus (e.g., 500, 800, 900, 1000, etc.). In one embodiment, at least one clamping member (e.g., 520, 812, 822, 832, etc.) may be in a raised position during loading of the device assemblies in step 1310. In one embodiment, at least one bending member (e.g., 530, 813, 823, 833, 931-938, etc.) may be in a lowered position during loading of the device assemblies in step 1310. And in one embodiment, step 1310 may be performed by a robot (e.g., with a mechanism for grasping the substrates, with a vacuum pick-up system capable of holding the substrates, etc.).

Step 1320 involves clamping the plurality of device assemblies (e.g., loaded in step 1310) to the plurality of trays of the apparatus. Step 1320 may involve lowering at least one clamping member (e.g., 520, 812, 822, 832, etc.) to clamp the plurality of device assemblies (e.g., loaded in step 1310) to the plurality of trays (e.g., 510, 811, 821, 831, etc.). The at least one clamping member may be contemporaneously moved in step 1320 by actuating (e.g., using an actuator such as actuator 1210, actuator 1220, actuator 1230, actuator 1240, actuator 1250, actuator 1260, etc.) a component (e.g., 590) coupled with the at least one clamping member.

As shown in FIG. 13, step 1330 involves applying a bending load to the plurality of device assemblies (e.g., loaded in step 1310). Step 1330 may involve raising at least one bending member (e.g., 530, 813, 823, 833, 931-938, etc.) to contact a respective film (e.g., similar to film 150) of each of the plurality of device assemblies and apply at least one respective bending load to each of the plurality of device assemblies. The at least one bending member may be contemporaneously moved in step 1330 by actuating (e.g., using an actuator such as actuator 1210, actuator 1220, actuator 1230, actuator 1240, actuator 1250, actuator 1260, etc.) a component (e.g., 570a, 570b, 941-948, etc.) coupled with the at least one bending member.

Step 1340 involves etching a plurality of release layers (e.g., similar to release layer 130) to separate a plurality of substrates (e.g., similar to substrate 110) from the plurality of device sub-assemblies (e.g., similar to device sub-assembly 170). In one embodiment, step 1340 may involve positioning a plurality of members (e.g., 540, 814, 824, 834, etc.) in a first position to enable fluid (e.g., such as HF, etc.) to pool or collect around the plurality of device assemblies (e.g., similar to device assembly 100), thereby enabling the release layers to be etched. In one embodiment, step 1340 may involve submerging at least one tray of an apparatus in a fluid (e.g., such as HF, etc.) to enable etching of a respective release layer (e.g., 130) of at least one device assembly (e.g., 100). And in one embodiment, step 1340 may involve spraying or otherwise directing a fluid (e.g., such as HF, etc.) toward the one or more device assemblies (e.g., 100) to enable etching of a respective release layer (e.g., 130). After etching, the plurality of members (e.g., 540, 814, 824, 834, etc.) may be positioned in a second position to enable the fluid to flow away from the plurality of device assemblies (e.g., into tank 1170).

In one embodiment, one or more of steps 1310 through 1340 may be performed using ELO system 410. And in one embodiment, one or more of steps 1310 through 1340 may be performed using system 1100 and/or system 1200.

As shown in FIG. 13, step 1350 involves processing the plurality of substrates (e.g., 110, similar to substrate 110, etc.) and/or the plurality of device assemblies (e.g., similar to device sub-assembly 170). For example, step 1350 may involve cleaning the device sub-assemblies (e.g., 170) and/or substrates (e.g., 110), rinsing the device sub-assemblies (e.g., 170) and/or substrates (e.g., 110), drying the device sub-assemblies (e.g., 170) and/or substrates (e.g., 110), performing another operation on the device sub-assemblies (e.g., 170) and/or substrates (e.g., 110), some combination thereof, etc. As another example, step 1350 may involve removing the substrates (e.g., 110) and/or the device sub-assemblies (e.g., 170) from the trays of the apparatus. And as yet another example, step 1350 may involve outputting the device sub-assemblies (e.g., 170) and/or substrates (e.g., 110) for reuse (e.g., the substrates may be used to produce other device assemblies and/or device sub-assemblies), for further processing, for storage, etc. In one embodiment, step 1350 may be performed using processing system 420.

In one embodiment, step 1350 may involve performing one or more operations (e.g., cleaning, rinsing, drying, etc.) on the substrates (e.g., 110) and/or device sub-assemblies (e.g., 170) while the substrates and/or device sub-assemblies remain in the trays of the apparatus. And in one embodiment, the substrates (e.g., 110) and device sub-assemblies (e.g., 170) may be processed (e.g., cleaned, rinsed, dried, etc.) in step 1350 before and/or after removing the substrates (e.g., 110) and/or device sub-assemblies (e.g., 170) from the trays of the apparatus.

In the foregoing specification, embodiments of the invention have been described with reference to numerous specific details that may vary from implementation to implementation. Thus, the sole and exclusive indicator of what is, and is intended by the applicant to be, the invention is the set of claims that issue from this application, in the specific form in which such claims issue, including any subsequent correction. Hence, no limitation, element, property, feature, advantage, or attribute that is not expressly recited in a claim should limit the scope of such claim in any way. Accordingly, the specification and drawings are to be regarded in an illustrative rather than a restrictive sense.

What is claimed is:

1. A method of performing epitaxial lift off, said method comprising:
    clamping, using a first plurality of members of an apparatus, a plurality of device assemblies to a plurality of trays of said apparatus, wherein each device assembly of said plurality of device assemblies comprises a respective device and a respective substrate, wherein said plurality of trays are physically spaced apart from one another in a stacked arrangement, and wherein said first plurality of members is coupled with a first component operable to contemporaneously move said first plurality of members;
    applying, using a second plurality of members of said apparatus, a bending load to said plurality of device assemblies, and wherein said second plurality of members is coupled with a second component operable to contemporaneously move said second plurality of members; and
    etching a respective release layer disposed between said respective device and said respective substrate to separate said respective device and said respective substrate.

2. The method of claim 1 further comprising:
    performing at least one operation on said respective substrate, wherein said at least one operation is selected from a group consisting of cleaning, rinsing and drying.

3. The method of claim 1 further comprising:
    performing at least one operation on said respective device, wherein said at least one operation is selected from a group consisting of cleaning, rinsing and drying.

4. The method of claim 1 further comprising:
    loading said plurality of device assemblies into said plurality of trays, and
    wherein said clamping further comprises actuating said first component to contemporaneously move said first plurality of members, and wherein said applying further comprises actuating said second component to contemporaneously move said second plurality of members.

5. The method of claim 1, wherein said plurality of device assemblies each comprise a respective device selected from a group consisting of a solar cell and a light emitting diode.

6. The method of claim 1, wherein said plurality of device assemblies further comprises a plurality of plastic films, wherein said first plurality of members is operable to interface with a respective first side of each of said plurality of plastic films, and wherein said second plurality of members is operable to interface with a respective second side of each of said plurality of plastic films.

7. The method of claim 1, wherein each of said second plurality of members is hoop shaped.

8. The method of claim 1, wherein said applying further comprises applying said bending load using a third plurality of members of said apparatus, and wherein said second and third plurality of members are operable to move independently of one another.

9. The method of claim 1, wherein said etching further comprises:
    placing a plurality of components of said plurality of trays in a first position;
    applying a fluid to said plurality of device assemblies to etch said respective release layer of said plurality of device assemblies; and
    placing said plurality of components in a second position to enable said fluid to flow away from said plurality of device assemblies.

* * * * *